(12) United States Patent
Kasai

(10) Patent No.: US 11,451,011 B2
(45) Date of Patent: Sep. 20, 2022

(54) LASER MODULE AND LASER SYSTEM

(71) Applicant: FUJIKURA LTD., Tokyo (JP)

(72) Inventor: Yohei Kasai, Chiba (JP)

(73) Assignee: Fujikura Ltd., Tokyo (JP)

( * ) Notice: Subject to any disclaimer, the term of this patent is extended or adjusted under 35 U.S.C. 154(b) by 269 days.

(21) Appl. No.: 16/756,423

(22) PCT Filed: Dec. 13, 2018

(86) PCT No.: PCT/JP2018/045828
§ 371 (c)(1),
(2) Date: Apr. 15, 2020

(87) PCT Pub. No.: WO2019/124204
PCT Pub. Date: Jun. 27, 2019

(65) Prior Publication Data
US 2020/0251880 A1 Aug. 6, 2020

(30) Foreign Application Priority Data

Dec. 22, 2017 (JP) .............................. JP2017-246939

(51) Int. Cl.
*H04B 10/00* (2013.01)
*H01S 5/40* (2006.01)
*G02B 6/42* (2006.01)
*H01S 5/02326* (2021.01)
(Continued)

(52) U.S. Cl.
CPC .......... *H01S 5/4012* (2013.01); *G02B 6/4207* (2013.01); *H01S 5/02326* (2021.01); *H01S 5/005* (2013.01); *H01S 5/02251* (2021.01)

(58) Field of Classification Search
CPC combination set(s) only.
See application file for complete search history.

(56) References Cited

U.S. PATENT DOCUMENTS 10,834,791 B2 * 11/2020 Tanaka .................. G06T 11/001
10,849,486 B2 * 12/2020 Oki ......................... A61B 90/20
11,016,294 B2 *  5/2021 Ichii .................... G02B 27/0093
(Continued)

FOREIGN PATENT DOCUMENTS

EP       2 940 503 A1    11/2015
EP       3 176 889 A1     6/2017
(Continued)

OTHER PUBLICATIONS

Extended European Search Report issued in corresponding European Patent Application No. 18891890.8 dated Sep. 20, 2021 (11 pages).

*Primary Examiner* — Agustin Bello
(74) *Attorney, Agent, or Firm* — Osha Bergman Watanabe & Burton LLP

(57) ABSTRACT

A laser module includes: an optical fiber; a plurality of semiconductor laser devices that includes a first semiconductor laser device and a second semiconductor laser device; a condenser lens that condenses laser beams emitted from the plurality of semiconductor laser devices and optically couples the laser beams to the optical fiber; a first terminal that supplies a first drive current to the first semiconductor laser device; and a second terminal that supplies a second drive current that to the second semiconductor laser device. The second drive current is smaller than the first drive current.

13 Claims, 7 Drawing Sheets

(51) Int. Cl.
 *H01S 5/02251* (2021.01)
 *H01S 5/00* (2006.01)

(56) References Cited

U.S. PATENT DOCUMENTS

| | | | |
|---|---|---|---|
| 11,062,633 B2* | 7/2021 | Komori | G02B 26/0833 |
| 11,187,899 B2* | 11/2021 | Tsukuda | H04N 9/3194 |
| 2003/0043865 A1* | 3/2003 | Nasu | H01S 5/0687 |
| | | | 372/32 |
| 2004/0062044 A1* | 4/2004 | Hanano | G03B 21/2033 |
| | | | 362/317 |
| 2005/0238071 A1* | 10/2005 | Oka | H04N 9/3129 |
| | | | 348/E9.026 |
| 2007/0098028 A1 | 5/2007 | Alcock et al. | |
| 2013/0100974 A1* | 4/2013 | Janssens | G03B 21/2013 |
| | | | 362/235 |
| 2015/0131692 A1 | 5/2015 | Hayamizu et al. | |
| 2015/0280404 A1 | 10/2015 | Kasai et al. | |
| 2016/0079728 A1 | 3/2016 | Matsuyama et al. | |
| 2017/0209032 A1* | 7/2017 | Matsunobu | A61B 1/07 |
| 2017/0248576 A1* | 8/2017 | Nishimura | G01N 15/06 |
| 2017/0271837 A1 | 9/2017 | Hemenway et al. | |
| 2017/0276546 A1* | 9/2017 | Sakai | H04N 9/3144 |
| 2017/0343792 A1* | 11/2017 | Matsunobu | A61B 5/062 |
| 2018/0067308 A1* | 3/2018 | Sakai | H04N 9/3182 |
| 2019/0097396 A1* | 3/2019 | Sakai | H04N 9/3129 |
| 2020/0251880 A1* | 8/2020 | Kasai | G02B 6/4207 |
| 2020/0285058 A1* | 9/2020 | Sangu | G02B 27/0172 |

FOREIGN PATENT DOCUMENTS

| | | |
|---|---|---|
| JP | 2013235943 A | 11/2013 |
| JP | 2014126852 A | 7/2014 |
| WO | 2014192944 A1 | 12/2014 |
| WO | 2016117108 A1 | 7/2016 |

* cited by examiner

LASER MODULE AND LASER SYSTEM

CROSS-REFERENCE TO RELATED APPLICATIONS

This is a U.S. National Stage application of International Application No. PCT/JP2018/045828 filed Dec. 13, 2018, which claims priority from Japanese patent application No. 2017-246939 filed Dec. 22, 2017. These references are incorporated herein by reference in their entirety.

TECHNICAL FIELD

The present invention relates to a laser module and a laser system, and more particularly to a laser module that condenses laser beams emitted from a plurality of semiconductor laser devices and outputs a condensed laser beam.

BACKGROUND

There has heretofore been known a laser module capable of condensing laser beams emitted from a plurality of semiconductor laser devices and outputting a high-power laser beam (see, e.g., Patent Literature 1 and Patent Literature 2). FIG. 1 is a partially cross-sectional plan view schematically showing an example of such a conventional semiconductor laser module, and FIG. 2 is a partially cross-sectional front view thereof. In the semiconductor laser module 500 illustrated in FIGS. 1 and 2, a plurality of submounts 530 are placed on a stepped pedestal 520 disposed within a housing 510. A semiconductor laser device 540 is placed on each of the submounts 530.

Furthermore, a fast-axis collimator lens 550 and a slow-axis collimator lens 560, which change a laser beam emitted from the semiconductor laser device 540 into a collimated beam, and a mirror 570, which changes a propagation direction of the laser beam that has transmitted through the slow-axis collimator lens 560 by 90 degrees, are provided so as to correspond to each of the semiconductor laser devices 540. An optical fiber 580 is introduced into an interior of the housing 510 from an exterior of the housing 510. A condenser lens 590 is disposed between the optical fiber 580 and the mirror 570. As shown in FIG. 2, laser beams reflected from the respective mirrors 570 are condensed and optically coupled to an end face of the optical fiber 580 by the condenser lens 590.

As shown in FIGS. 1 and 2, optical path lengths of the laser beams from laser output surfaces of the respective semiconductor laser devices 540 to an incidence surface of the condenser lens 590 are different from one semiconductor laser devices 540 to another. In the illustrated example, the laser beam from the semiconductor laser device 540A has the shortest optical path length from the laser output surface to the incidence surface of the condenser lens 590, whereas the laser beam from the semiconductor laser device 540H has the longest optical path length from the laser output surface to the incidence surface of the condenser lens 590.

A laser beam emitted from each of the semiconductor laser devices 540 is formed into a generally collimated beam by the collimator lenses 550 and 560. Nevertheless, the laser beam that passed through the collimator lenses 550 and 560 is not a completely collimated beam and has a slight divergence angle due to aberration or the like. Therefore, as the optical path length of a laser beam to the incidence surface of the condenser lens 590 is longer, the width of the laser beam increases during the propagation. Thus, a condensing angle for the condenser lens 590 to condense the laser beam into an incidence surface of the optical fiber 580 is increased. As described above, in the illustrated example, the laser beam from the semiconductor laser device 540H has the longest optical path length. Accordingly, the laser beam emitted from the semiconductor laser device 540H has the largest converging angle.

FIG. 3 is a diagram schematically showing a converging angle profile of laser beams 542A-542H from the respective semiconductor laser devices 540 on the incidence surface of the optical fiber 580. In FIG. 3, the point O completely coincides with an optical axis of the optical fiber 580. As the distance from the point O is longer, the incidence angle of the laser beam increases with respect to the optical axis of the optical fiber 580. The horizontal direction of FIG. 3 corresponds to the slow axis, whereas the vertical direction corresponds to the fast axis. FIG. 3 illustrates the converging angle profile of the laser beams that have condensed by the condenser lens 590. Therefore, the laser beam 542H from the semiconductor laser device 540H, which is incident on the condenser lens 590 at the highest position of FIG. 2, is located at the lowermost position of FIG. 3. The laser beam 542A from the semiconductor laser device 540A, which is incident on the condenser lens 590 at the lowest position of FIG. 2, is located at the uppermost position of FIG. 3.

A slow-axis component of a laser beam emitted from a high-power semiconductor laser device includes multimode light and has a large divergence angle. Therefore, as shown in FIG. 3, the aforementioned dependency on the optical path length is noticeably observed along the slow axis. In other words, the divergence angle of the laser beam 542H, which has the longest optical path length, along the slow axis is greater than the divergence angle of the laser beam 542A, which has the shortest optical path length.

An optical fiber usually has a concentrically distributed refractive index. Accordingly, an area of an optical fiber that can receive light (NA) has a circular shape in FIG. 3. When NA of the optical fiber 580 is set with respect to the laser beam 542A, which has the shortest optical path length, a light-receiving area of the optical fiber 580 is defined as the range R1 in FIG. 3. In this case, portions of laser beams having longer optical path lengths (portions of the laser beams 542E, 542F, 542G, and 542H) cannot be optically coupled to the optical fiber 580. Thus, coupling loss is caused so as to limit an optical output of the laser module.

Meanwhile, when NA of the optical fiber 580 is set with respect to the laser beam 542H, which has the longest optical path length, a light-receiving area of the optical fiber 580 is defined as the range R2 in FIG. 3. In this case, the incidence density of the laser beams within the range R2 is so low that the filling density of light decreases in the optical fiber 580 while no coupling loss is caused. Accordingly, the brightness of the laser beam emitted from the laser module is lowered.

Generally, for a pumping application in a high-power fiber laser, optical outputs from a plurality of laser modules are combined by a combiner or the like to further increase the output power. To what extent an output of a fiber laser can be increased is determined by the brightness of an optical output from a laser module. The brightness of an optical output from a laser module decreases in proportion to the square of NA of the optical fiber. Therefore, there has been a demand for minimizing NA of an optical fiber.

Thus, when laser beams from a plurality of semiconductor laser devices are condensed, there is a trade-off in the prior art between reduction in coupling loss of the laser beams and reduction in NA of the optical fiber to output a laser beam with high brightness. Therefore, it has been difficult to achieve both reductions.

One or more embodiments of the present invention provide a laser module capable of reducing coupling loss of laser beams that are emitted from a plurality of semiconductor laser devices and optically coupled to an optical fiber and of maintaining high brightness of a laser beam outputted from the optical fiber.

Furthermore, one or more embodiments of the present invention provide a laser system capable of outputting a laser beam with high brightness.

PATENT LITERATURE

Patent Literature 1: JP 2013-235943 A
Patent Literature 2: JP 2014-126852 A

SUMMARY

According to one or more embodiments of the present invention, there is provided a laser module capable of reducing coupling loss of laser beams that are emitted from a plurality of semiconductor laser devices and optically coupled to an optical fiber and of maintaining high brightness of a laser beam outputted from the optical fiber. The laser module has an optical fiber, a plurality of semiconductor laser devices including at least a first semiconductor laser device and a second semiconductor laser device, a condenser lens configured to condense laser beams emitted from the plurality of semiconductor laser devices and optically couple the laser beams to the optical fiber, a first terminal to supply a first drive current to the first semiconductor laser device, and a second terminal to supply a second drive current that is smaller than the first drive current to the second semiconductor laser device. An optical path length of the laser beam from a laser output surface of the second semiconductor laser device to an incidence surface of the condenser lens is longer than an optical path length of the laser beam from a laser output surface of the first semiconductor laser device to the incidence surface of the condenser lens.

With this configuration, a drive current for the second semiconductor laser device that emits a laser beam having a longer optical path length from the laser output surface to the incidence surface of the condenser lens can be made smaller than a drive current for the first semiconductor laser device, which emits a laser beam having a shorter optical path length. The width of the laser beam emitted from the second semiconductor device tends to increase because the laser beam has a long optical path length. However, the divergence of the laser beam emitted from the second semiconductor laser device can be reduced as compared to a case where the same drive current is supplied to the first semiconductor laser device and the second semiconductor laser device. Therefore, laser beams from all of the semiconductor laser devices can more likely be incident on an inside of a small light-receiving range of the optical fiber. As a result, coupling loss of the laser beams can be reduced, and an incidence density of the laser beams within the light-receiving range can be increased. Accordingly, high brightness of an output laser beam can be maintained.

The optical path length of the laser beam from the laser output surface of the second semiconductor laser device to the incidence surface of the condenser lens may be the longest in the laser module among optical path lengths of the laser beams from laser output surfaces of the plurality of semiconductor laser devices to the incidence surface of the condenser lens. In this case, the second drive current may be the smallest among drive currents supplied to the plurality of semiconductor laser devices. The width of a laser beam having the longest optical path length from a laser output surface of a semiconductor laser device to an incidence surface of a condenser lens has the strongest tendency to increase. With the above configuration, the divergence of a laser beam from such a semiconductor laser device can effectively be reduced.

The laser module may include a first group of semiconductor laser devices including at least the first semiconductor laser device and a second group of semiconductor laser devices including at least the second semiconductor laser device. In this case, a maximum value of incidence angles of laser beams incident on the optical fiber from the first group of semiconductor laser devices and a maximum value of incidence angles of laser beams incident on the optical fiber from the second group of semiconductor laser devices may be less than or equal to a maximum acceptance angle of the optical fiber. With this configuration, all of the laser beams emitted from the first group of semiconductor laser devices and the second group of semiconductor laser devices can be incident on an inside of the light-receiving range of the optical fiber. Thus, coupling loss of the laser beams can be reduced.

Furthermore, the maximum value of the incidence angles of the laser beams incident on the optical fiber from the first group of semiconductor laser devices may be equal to the maximum value of the incidence angles of the laser beams incident on the optical fiber from the second group of semiconductor laser devices. With this configuration, all of the laser beams can be incident with high density on an inside of a circle having a certain radius about a center of the optical fiber.

According to one or more embodiments of the present invention, there is provided a laser system capable of outputting a laser beam with high brightness. The laser system has the aforementioned laser module, a first current supply unit operable to supply the first drive current to the first terminal of the laser module, and a second current supply unit operable to supply the second drive current to the second terminal of the laser module.

With this configuration, while coupling loss of laser beams that are emitted from a plurality of semiconductor laser devices and optically coupled to the optical fiber can be reduced in the laser module, high brightness of a laser beam outputted from the optical fiber can be maintained. Accordingly, a laser beam having high brightness can be outputted from the laser system.

Furthermore, the laser system may have, in addition to the laser module, another laser module as described above as an additional laser module. In this case, the first current supply unit is operable to supply the first drive current to the first terminal of the laser module and the first terminal of the additional laser module, and the second current supply unit is operable to supply the second terminal of the laser module and the second terminal of the additional laser module.

With this configuration, a laser beam outputted from the aforementioned laser module and a laser beam outputted from the additional laser module can be combined, so that a laser beam with higher power can be outputted.

According to the present invention, while coupling loss of laser beams that are emitted from a plurality of semiconductor laser devices and optically coupled to an optical fiber can be reduced, high brightness of a laser beam outputted from the optical fiber can be maintained.

DETAILED DESCRIPTION

Figure 1:
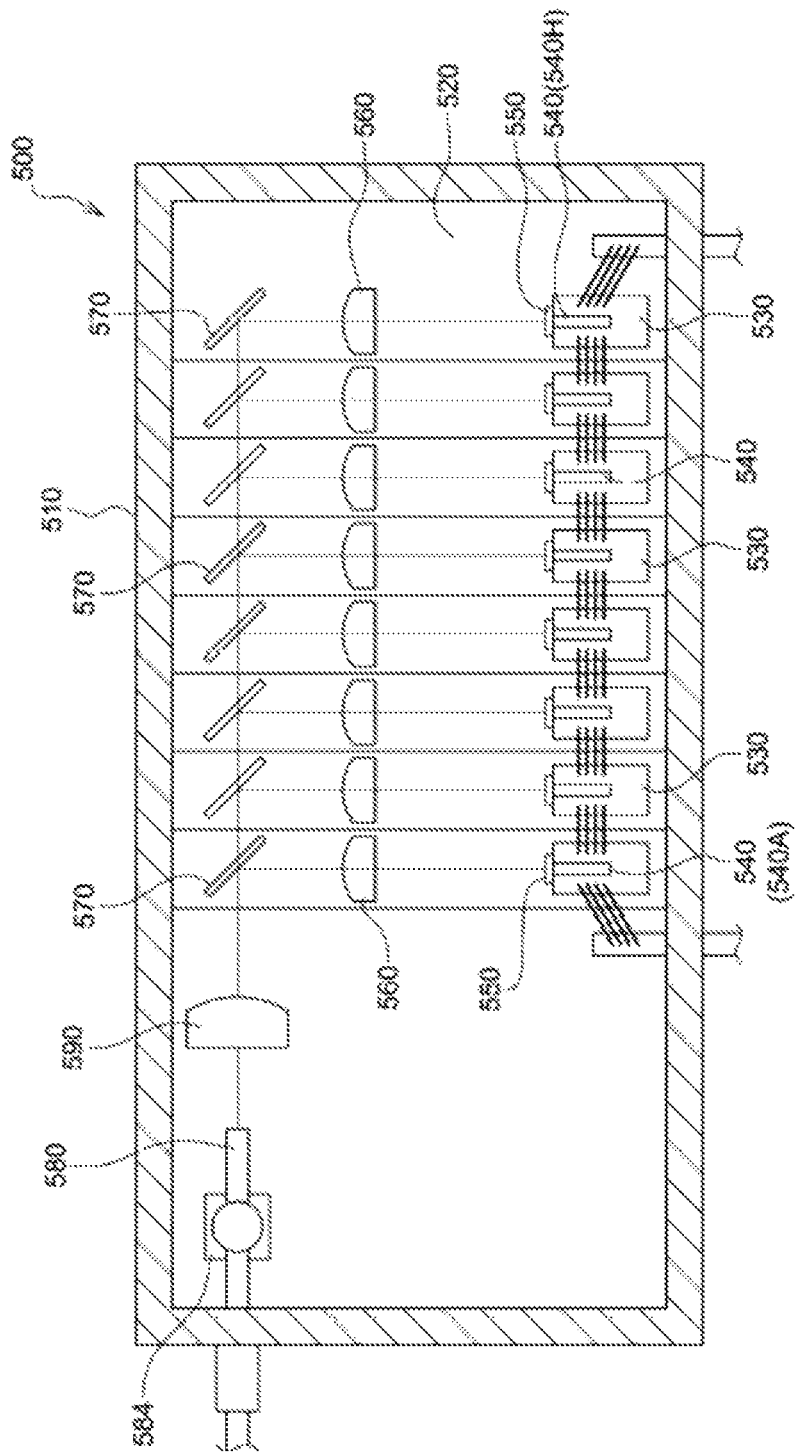
FIG. 1 is a partially cross-sectional plan view schematically showing a conventional laser module.

Embodiments of a laser system according to the present invention will be described in detail below with reference to FIGS. 4 to 7. In FIGS. 4 to 7, the same or corresponding components are denoted by the same or corresponding reference numerals and will not be described below repetitively. Furthermore, in FIGS. 4 to 7, the scales or dimensions of components may be exaggerated, or some components may be omitted.

Figure 4:
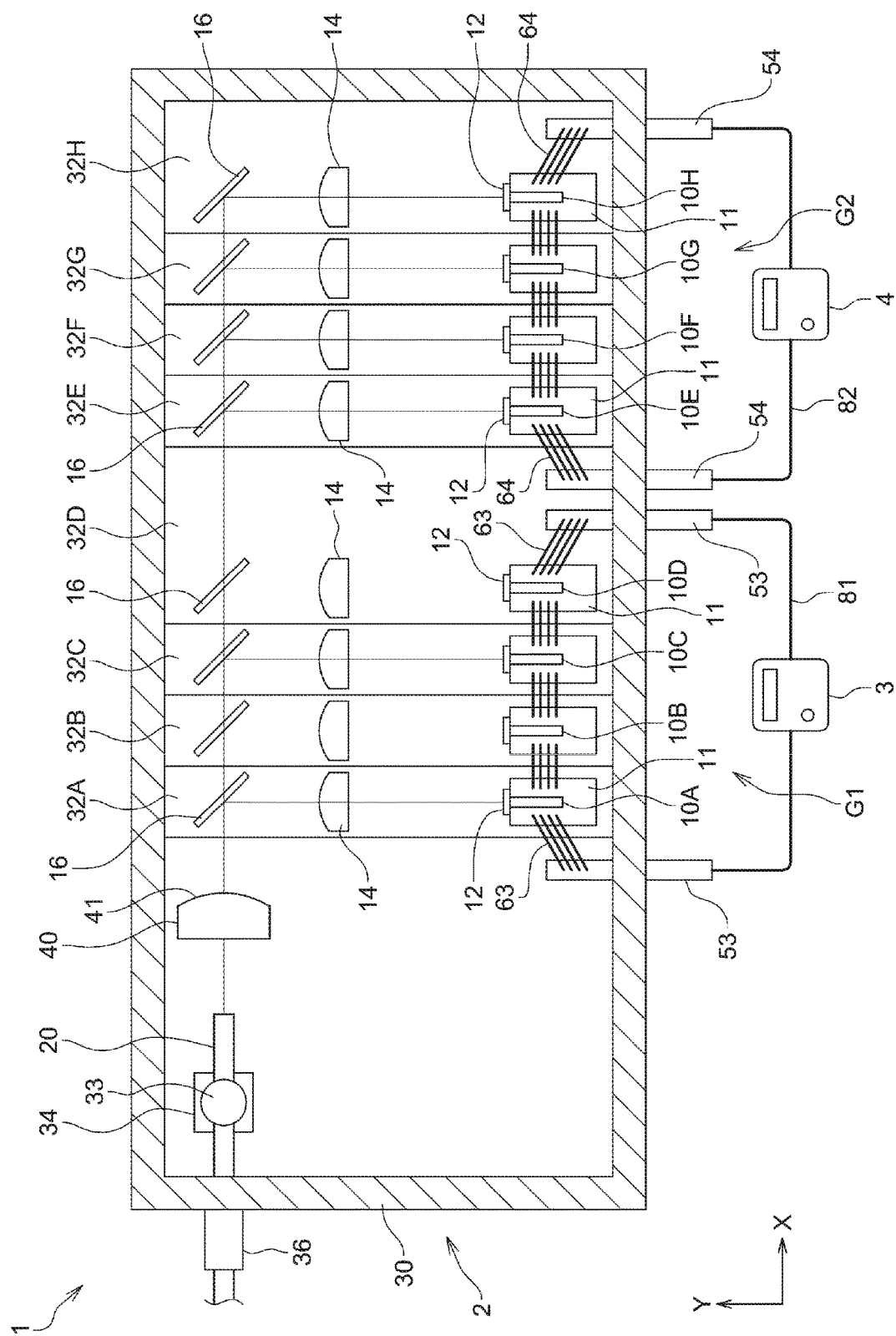
FIG. 4 is a partially cross-sectional plan view schematically showing a laser system according to one or more embodiments of the present invention.

FIG. 4 is a partially cross-sectional plan view schematically showing a laser system 1 according to one or more embodiments of the present invention. The laser system 1 has a laser module 2 including a plurality of semiconductor laser devices 10A-10H and an optical fiber 20, a first current supply driver (first current supply unit) 3 operable to supply a drive current to the semiconductor laser devices 10A-10D of the laser module 2, and a second current supply driver (second current supply unit) 4 operable to supply a drive current to the semiconductor laser devices 10E-10H of the laser module 2.

Figure 5:
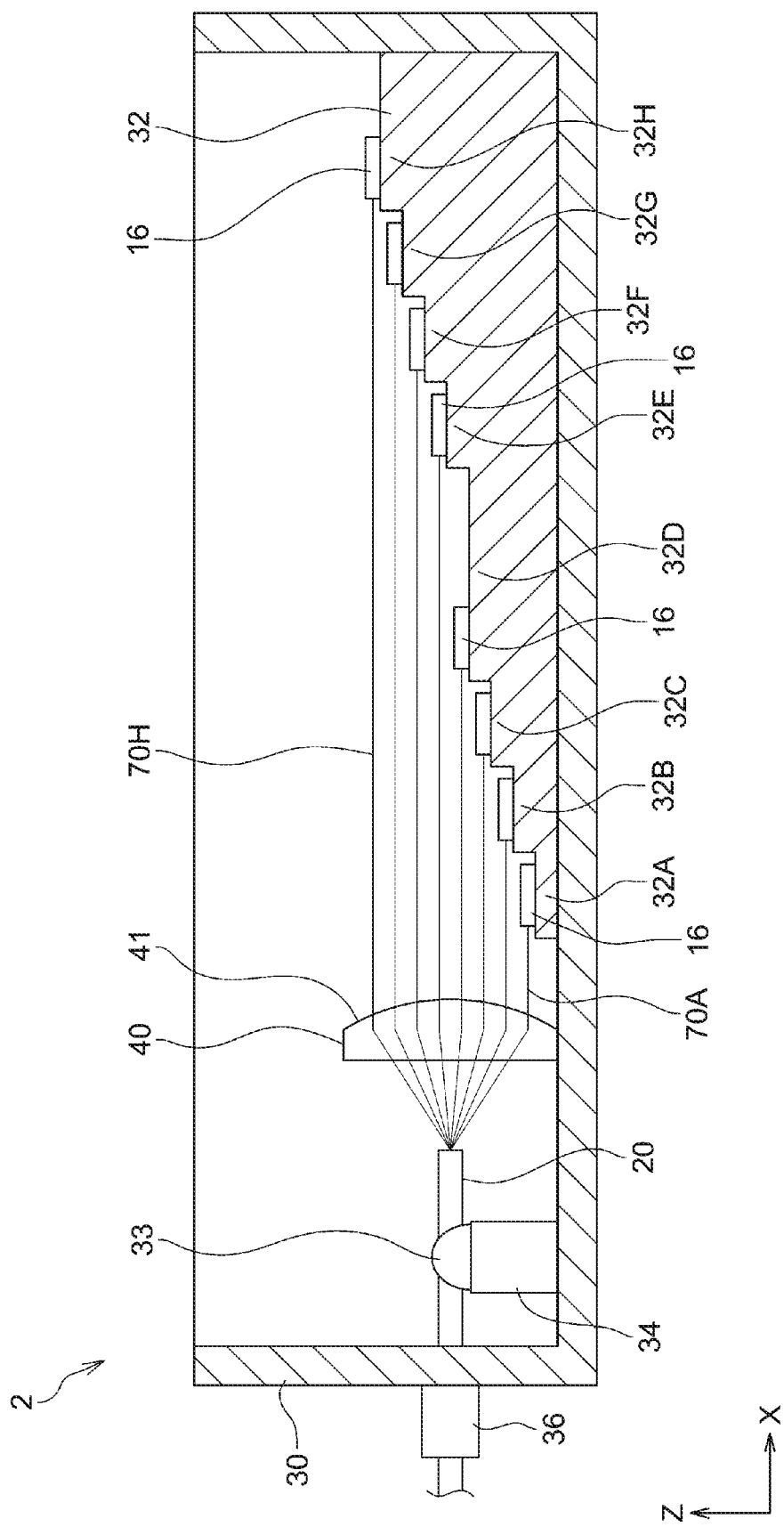
FIG. 5 is a partially cross-sectional front view schematically showing a laser module in the laser system of FIG. 4.

FIG. 5 is a partially cross-sectional front view schematically showing the laser module 2. As shown in FIGS. 4 and 5, the laser module 2 includes a housing 30, a stepped pedestal 32 disposed within the housing 30, a fiber mount 34 for fixing the optical fiber 20, and a cylindrical fiber holder 36 for holding the optical fiber 20 and introducing the optical fiber 20 into an interior of the housing 30. The optical fiber 20 is fixed on the fiber mount 34 by an adhesive material 33. A cover member, which is not shown, is disposed on the housing 30. The internal space of the housing is sealed by the cover member.

A submount 11 is disposed on each of steps 32A-32H of the pedestal 32. The semiconductor laser devices 10E-10H are placed on the respective submounts 11. Each of the steps 32A-32H has a fast-axis collimator lens 12 configured to collimate a laser beam emitted from the semiconductor laser device with respect to the fast axis, a slow-axis collimator lens 14 configured to collimate a laser beam that has transmitted through the fast-axis collimator lens 12 with respect to the fast axis, and a mirror 16 configured to change a propagation direction of the laser beam that has transmitted through the slow-axis collimator lens 14 by 90 degrees, correspondingly to the semiconductor laser devices 10A-10H. Furthermore, a condenser lens 40 is disposed between an end face of the optical fiber 20 that extends into the interior of the housing 30 and the mirror 16 to condense laser beams reflected from the mirrors 16 so that the laser beams are optically coupled to the end face of the optical fiber 20.

Referring back to FIG. 4, the laser module 2 has two pairs of lead terminals 53 and 54 extending through a sidewall of the housing 30 for supplying drive currents to the semiconductor laser devices 10A-10H. The four semiconductor laser devices 10A, 10B, 10C, and 10D are connected in series between one pair of lead terminals (first terminals) 53 by metal wires 63. Those lead terminals 53 are connected to the first current supply driver 3 by wires 81. The first current supply driver 3 is configured to supply a drive current to the lead terminal 53 so as to drive the semiconductor laser devices 10A, 10B, 10C, and 10D. The four semiconductor laser devices 10E, 10F, 10G, and 10H are connected in series between another pair of lead terminals (second terminals) 54 by metal wires 64. Those lead terminals 54 are connected to the second current supply driver 4 by wires 82. The second current supply driver 4 is configured to supply a drive current to the lead terminal 54 so as to drive the semiconductor laser devices 10E, 10F, 10G, and 10H.

With this configuration, when drive currents are supplied to the semiconductor laser devices 10A-10H by the current supply drivers 3 and 4, laser beams are emitted in the +Y-direction from the semiconductor laser devices 10A-10H. Each of the laser beams transmits through the fast-axis collimator lens 12 and the slow-axis collimator lens 14 so as to form a generally collimated beam. Then the mirror 16 changes the direction of the generally collimated beam into the −X-direction by 90 degrees. As shown in FIG. 5, the steps 32A-32H of the pedestal 32 have different heights (in the Z-direction). Therefore, the laser beams that have been changed in direction by the respective mirrors 16 propagate in parallel to each other at different heights toward the −Z-direction. Those laser beams are condensed by the condenser lens 40 and optically coupled to the end face of the optical fiber 20.

In one or more embodiments, the steps 32A-32H of the pedestal 32, on which the semiconductor laser devices 10A-10H are disposed, are located at different positions along the X-direction. Therefore, optical path lengths of laser beams from laser output surfaces of the respective semiconductor laser devices 10A-10H to an incidence surface 41 of the condenser lens 40 are different from one of the semiconductor laser devices 10A-10H to another. In the example shown in FIG. 5, a laser beam 70A from the laser output surface of the semiconductor laser device 10A to the incidence surface 41 of the condenser lens 40 has the shortest optical path length, and a laser beam 70H from the laser output surface of the semiconductor laser device 10H to the incidence surface 41 of the condenser lens 40 has the longest optical path length.

Figure 2:
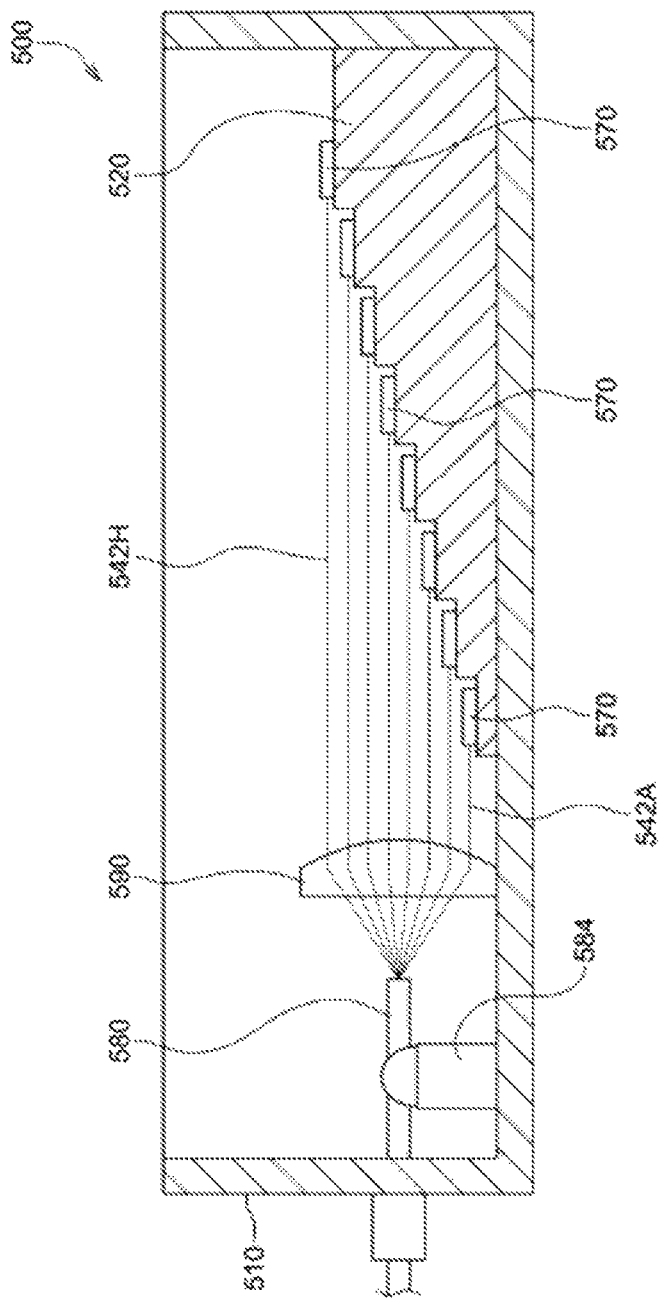
FIG. 2 is a partially cross-sectional front view schematically showing the laser module of FIG. 1.

As described above, as the optical path length of a laser beam to the incidence surface of the condenser lens 40 is longer, the width of the laser beam increases during the propagation. Therefore, with the conventional configuration shown in FIGS. 1 and 2, it has been difficult to achieve both of reduction in coupling loss of the laser beams and output of a laser beam with high brightness. According to one or more embodiments, a current supplied to a semiconductor laser device that emits a laser beam having a relatively longer optical path length from a laser output surface of the semiconductor laser device to the incidence surface 41 of the condenser lens 40 is made smaller than a current supplied to a semiconductor laser device that emits a laser beam having a relatively shorter optical path length. This configuration achieves both of reduction in coupling loss of the laser beams and output of a laser beam with high brightness. This feature will be described below in greater detail.

Generally, it has been known that, when a drive current supplied to a semiconductor laser device is increased, a divergence angle of an emitted laser beam increases in the slow-axis direction. Therefore, if a drive current supplied to a semiconductor laser device is decreased, a divergence angle of a laser beam emitted from the semiconductor laser device decreases. One or more embodiments employ such characteristics of a semiconductor laser device to achieve both of reduction in coupling loss of the laser beams and output of a laser beam with high brightness.

Specifically, the semiconductor laser devices 10A-10H are divided into a plurality of groups (laser device groups) according to the optical path lengths from the laser output surfaces of the semiconductor laser devices to the incidence surface 41 of the condenser lens 40. The respective groups of semiconductor laser devices are supplied with different drive currents. In one or more embodiments, the semiconductor laser devices 10A-10H are divided into a group of semiconductor laser devices 10A, 10B, 10C, and 10D (group G1), which emit laser beams having shorter optical path lengths to the incidence surface 41 of the condenser lens 40, and a group of semiconductor laser devices 10E, 10F, 10G, and 10H (group G2), which emit laser beams having longer optical path lengths to the incidence surface 41 of the condenser lens 40. The first current supply driver 3 is connected to the group G1 via the wires 81 and the lead terminals 53, and the second current supply driver 4 is connected to the group G2 via the wires 82 and the lead terminals 54. In the group G1, the semiconductor laser devices 10A, 10B, 10C, and 10D are connected in series. In the group G2, the semiconductor laser devices 10E, 10F, 10G, and 10H are connected in series.

The second current supply driver 4 is configured to supply, to the group G2, a drive current (second drive current) that is smaller than a drive current (first drive current) supplied to the group G1 by the first current supply driver 3. With this configuration, divergence angles of the laser beams emitted from the group G2 of the semiconductor laser devices 10E, 10F, 10G, and 10H can be made relatively smaller than divergence angles of the laser beams emitted from the group G1 of the semiconductor laser devices 10A, 10B, 10C, and 10D.

Figure 3:
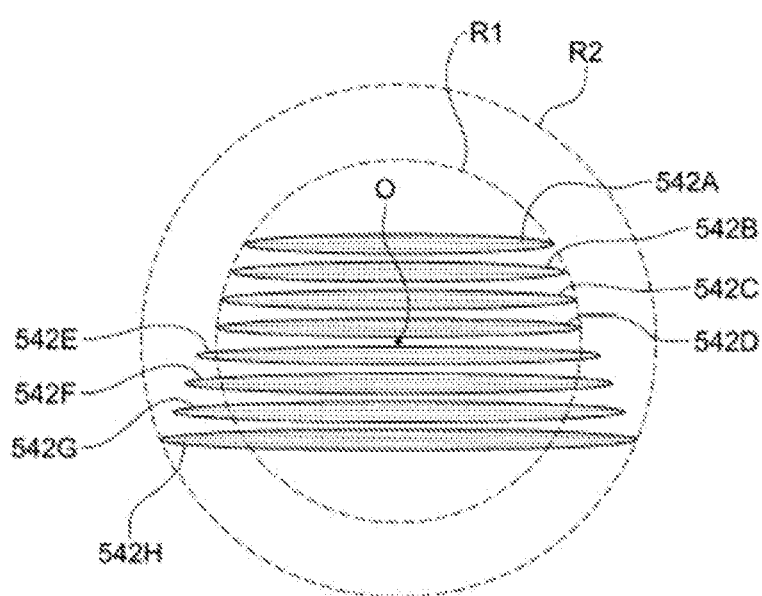
FIG. 3 is a diagram schematically showing a converging angle profile of laser beams from respective semiconductor laser devices on an incidence surface of an optical fiber in the laser module of FIG. 1.
Figure 6:
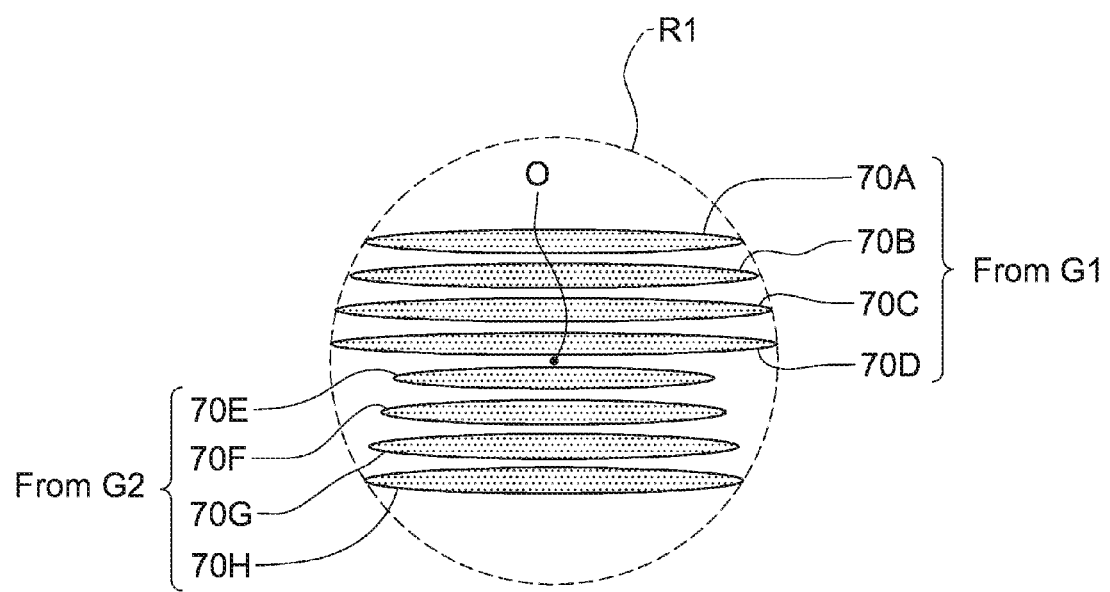
FIG. 6 is a diagram schematically showing a converging angle profile of laser beams from respective semiconductor laser devices on an incidence surface of an optical fiber in the semiconductor laser module of FIG. 5.

FIG. 6 is a diagram schematically showing a converging angle profile of laser beams 70A-70H from the respective semiconductor laser devices 10A-10H on the incidence surface of the optical fiber 20 according to one or more embodiments. As with FIG. 3, the point O of FIG. 6 completely coincides with an optical axis of the optical fiber 20. In the profile of FIG. 6, a distance from the point O represents an incidence angle of a laser beam with respect to the optical fiber 20. In FIG. 6, the laser beam 70H from the semiconductor laser device 10H, which is incident on the condenser lens 40 at the highest position of FIG. 5, is located at the lowermost position of FIG. 6. The laser beam 70A from the semiconductor laser device 10A, which is incident on the condenser lens 40 at the lowest position of FIG. 5, is located at the uppermost position of FIG. 6.

As described above, a drive current supplied to the group G2 of the semiconductor laser devices 10E, 10F, 10G, and 10H is made smaller than a drive current supplied to the group G1 of the semiconductor laser devices 10A, 10B, 10C, and 10D. Thus, as shown in FIG. 6, the divergence of the laser beams 70E, 70F, 70G, and 70H emitted from the semiconductor laser devices 10E, 10F, 10G, and 10H can be reduced along the slow axis as compared to FIG. 3. In the conventional example of FIG. 3, portions of the laser beams 542E, 542F, 542G, and 542H are incident on an outside of the light-receiving range R1, so that coupling loss is caused. In the example shown in FIG. 6, all of the laser beams 70A-70H including the laser beams 70E, 70F, 70G, and 70H can be incident on an inside of the light-receiving range R1 of the optical fiber 20. In other words, a drive current supplied to the group G2 by the second current supply driver 4 is made smaller than a drive current supplied to the group G1 by the first current supply driver 3 such that a maximum value of incidence angles of the laser beams 70A, 70B, 70C, and 70D that have been emitted from the group G1 of the semiconductor laser devices 10A, 10B, 10C, and 10D and are incident on the optical fiber 20 and a maximum value of incidence angles of the laser beams 70E, 70F, 70G, and 70H that have been emitted from the group G2 of the semiconductor laser devices 10E, 10F, 10G, and 10H and are incident on the optical fiber 20 are smaller than or equal to the maximum acceptance angle (NA) of the optical fiber 20 (such that the furthest portions of the respective areas of the laser beams 70A, 70B, 70C, and 70D away from the point O and the furthest potions of the respective areas of the laser beams 70E, 70F, 70G, and 70H away from the point O are located within the light-receiving range R1 of the optical fiber 20 in the profile of FIG. 6).

With this configuration, all of the laser beams 70A-70H emitted from the group G1 and the group G2 of the semiconductor laser devices 10A-10H can be incident on the inside of the light-receiving range R1 of the optical fiber 20. Therefore, coupling loss of the laser beams can be reduced. Furthermore, all of the laser beams 70A-70H can be incident on the inside of the light-receiving range R1, which is smaller than the light-receiving range R2 (see FIG. 3). Accordingly, the incidence density of the laser beams in the light-receiving range R1 can be increased, so that high brightness of an output laser beam can be maintained.

In this case, a maximum value of incidence angles of the laser beams 70A, 70B, 70C, and 70D that have been emitted from the group G1 of the semiconductor laser devices 10A, 10B, 10C, and 10D and are incident on the optical fiber 20 may be equal to a maximum value of incidence angles of the laser beams 70E, 70F, 70G, and 70H that have been emitted from the group G2 of the semiconductor laser devices 10E, 10F, 10G, and 10H and are incident on the optical fiber 20. In other words, the furthest portions of the respective areas of the laser beams 70A, 70B, 70C, and 70D away from the point O and the furthest potions of the respective areas of the laser beams 70E, 70F, 70G, and 70H away from the point O may be located on the same circle with the center at the point O in the profile of FIG. 6. With this configuration, all of the laser beams 70A-70H can be incident with high density on an inside of a circle having a certain radius about the point O.

Figure 7:
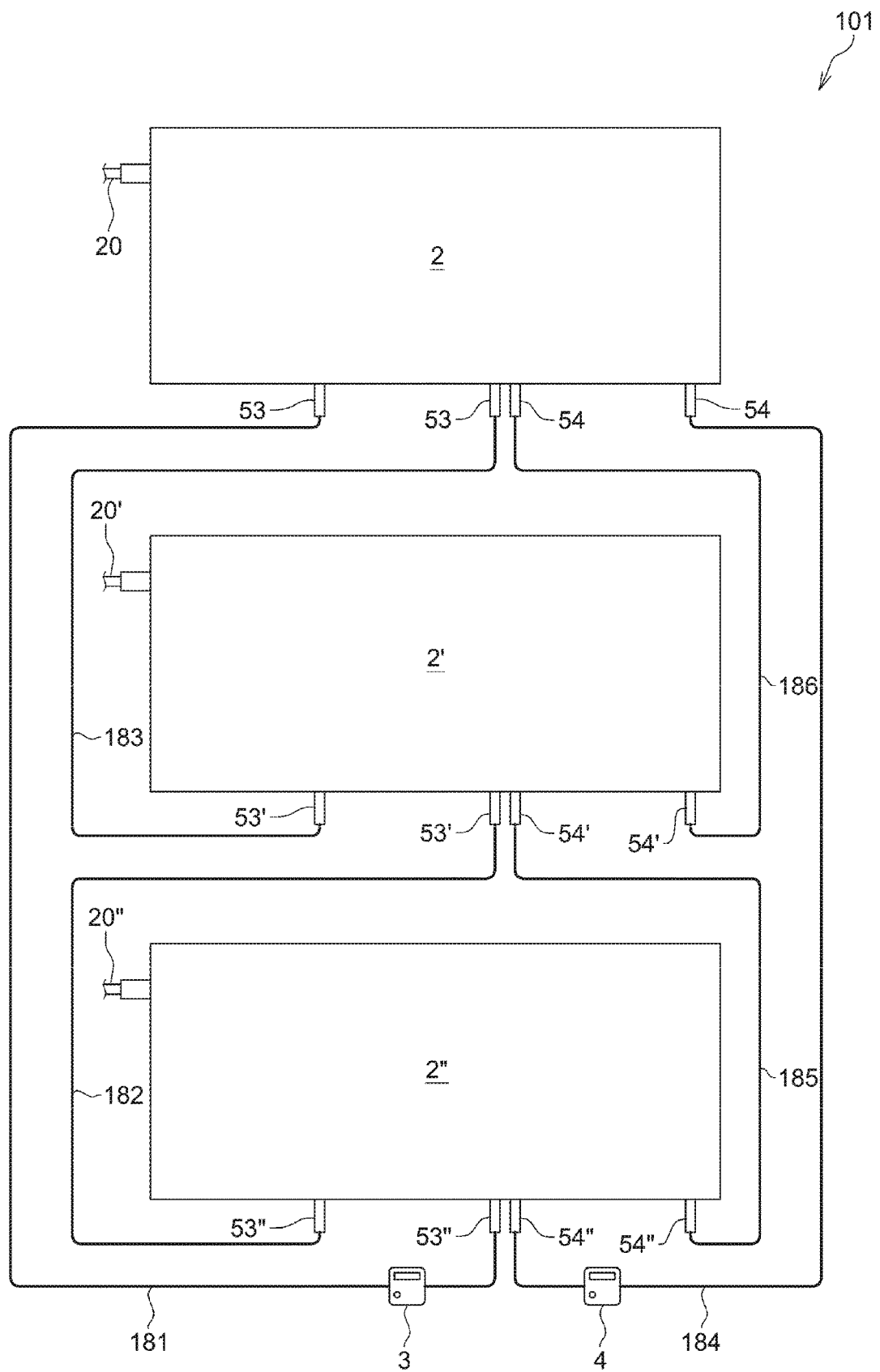
FIG. 7 is a diagram schematically showing a laser system according to one or more embodiments of the present invention.

FIG. 7 is a diagram schematically showing a laser system 101 according to one or more embodiments of the present invention. The laser system 101 according to one or more embodiments has laser modules (additional laser modules) 2' and 2" having the same configuration as the laser module 2, in addition to the laser module 2 of the aforementioned embodiments. The laser modules 2' and 2" have the same internal arrangement as the laser module 2. Therefore, the detailed description of the internal arrangement of the laser modules 2' and 2" will be omitted.

As with the laser module 2, a group G1 of the semiconductor laser devices (see FIG. 4) are connected in series between the lead terminals 53' of the laser module 2', and a group G1 of the semiconductor laser devices are connected in series between the lead terminals 53″ of the laser module 2″. The lead terminals 53 of the laser module 2, the lead terminals 53′ of the laser module 2′, and the lead terminals 53″ of the laser module 2″ are connected to the aforementioned first current supply driver 3 by wires 181, 182, and 183 such that the group G1 of the semiconductor laser devices of the laser module 2, the group G1 of the semiconductor laser devices of the laser module 2′, and the group G1 of the semiconductor laser devices of the laser module 2″ are connected in series.

Similarly, a group G2 of the semiconductor laser devices (see FIG. 4) are connected in series between the lead terminals 54′ of the laser module 2′, and a group G2 of the semiconductor laser devices are connected in series between the lead terminals 54″ of the laser module 2″. The lead terminals 54 of the laser module 2, the lead terminals 54′ of the laser module 2′, and the lead terminals 54″ of the laser module 2″ are connected to the aforementioned second current supply driver 4 by wires 184, 185, and 186 such that the group G2 of the semiconductor laser devices of the laser module 2, the group G2 of the semiconductor laser devices of the laser module 2′, and the group G2 of the semiconductor laser devices of the laser module 2″ are connected in series.

Thus, the first current supply driver 3 supplies a drive current to the lead terminals 53, 53′, and 53″ of the laser modules 2, 2′, and 2″ so as to drive the groups G1 of the semiconductor laser devices in those laser modules. Furthermore, the second current supply driver 4 supplies a drive current to the lead terminals 54, 54′, and 54″ of the laser modules 2, 2′, and 2″ so as to drive the groups G2 of the semiconductor laser devices in those laser modules.

The second current supply driver 4 is configured to supply, to the groups G2, a drive current (second drive current) that is smaller than a drive current (first drive current) supplied to the groups G1 by the first current supply driver 3. With this configuration, in each of the laser modules 2, 2′, and 2″, divergence angles of the laser beams emitted from the groups G2 of the semiconductor laser devices can be made relatively smaller than divergence angles of the laser beams emitted from the groups G1 of the semiconductor laser devices. Thus, this configuration achieves both of reduction in coupling loss of the laser beams and output of a laser beam with high brightness. Furthermore, in one or more embodiments, laser beams outputted from the optical fibers 20, 20′, and 20″ of a plurality of laser modules 2, 2′, and 2″ can be combined by a combiner, which is not shown, or the like, so that a laser beam with higher power can be outputted.

In the aforementioned embodiments, eight semiconductor laser devices 10A-10H are arranged in the laser module 2. Nevertheless, the number of the semiconductor laser devices is not limited to those examples. Furthermore, the semiconductor laser devices 10A-10H in the laser module 2 are divided into two groups according to the optical path lengths. However, the semiconductor laser devices in the laser module may be divided into three or more groups. In this case, current supply drivers (current supply units) are provided so as to correspond to the respective groups so that different currents are supplied to the respective groups. Furthermore, the number of semiconductor laser devices included in one group can be one or more and is not limited to a specific value.

Moreover, one or more semiconductor laser devices (second semiconductor laser devices) supplied with a drive current smaller than a drive current supplied to other semiconductor laser devices may be any of a plurality of semiconductor laser devices in a laser module. Nevertheless, the width of a laser beam having the longest optical path length from a laser output surface of a semiconductor laser device to an incidence surface of a condenser lens has the strongest tendency to increase. Therefore, a drive current supplied to a semiconductor laser device that emits a laser beam having the longest optical path length from a laser output surface of the semiconductor laser device to an incidence surface of a condenser lens may be lower than a drive current supplied to other semiconductor laser devices and may be the lowest in a laser module. In such a case, the divergence of a laser beam emitted from a semiconductor laser device, which has a width having the strongest tendency to increase, can effectively be reduced.

Furthermore, in the aforementioned embodiments, the stepped pedestal 32 is used to form a plurality of paths of laser beams from a plurality of semiconductor laser devices. Nevertheless, the propagation method of laser beams from a plurality of semiconductor laser devices is not limited to those examples. For example, the present invention is applicable to laser modules that employ various kinds of propagation methods as disclosed in FIGS. 1 and 11 of Patent Literature 2 described above.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The present invention may be used for a laser module that condenses laser beams emitted from a plurality of semiconductor laser devices and outputs a condensed laser beam.

REFERENCE SIGNS LIST

1 Laser system
2 Laser module
3 First current supply driver
4 Second current supply driver
10A-10H Semiconductor laser device
11 Submount
12 Fast-axis collimator lens
14 Slow-axis collimator lens
16 Mirror
20 Optical fiber
30 Housing
32 Pedestal
32A-32H Step
40 Condenser lens
41 Incidence surface
53 Lead terminal
54 Lead terminal
63, 64 Metal wire
70A-70H Laser beam
81, 82 Wire
101 Laser system
181-186 Wire

The invention claimed is:

1. A laser module comprising:
an optical fiber;
a plurality of semiconductor laser devices including:
   a first semiconductor laser device; and
   second semiconductor laser devices;
a condenser lens that condenses laser beams emitted from the plurality of semiconductor laser devices and optically couples the laser beams to the optical fiber;

a first pair of terminals that supplies a first drive current to the first semiconductor laser device; and a second pair of terminals that supplies a second drive current to the second semiconductor laser devices, wherein the second drive current is smaller than the first drive current, the second semiconductor laser devices are electrically connected in series between the second pair of terminals, and an optical path length of a laser beam from a laser output surface of each of the second semiconductor laser devices to an incidence surface of the condenser lens is longer than an optical path length of a laser beam from a laser output surface of the first semiconductor laser device to the incidence surface of the condenser lens.

2. The laser module according to claim 1, wherein the optical path length of the laser beam from the laser output surface of one of the second semiconductor laser devices to the incidence surface of the condenser lens is the longest among optical path lengths of the laser beams from laser output surfaces of the plurality of semiconductor laser devices to the incidence surface of the condenser lens.

3. The laser module according to claim 2, wherein the second drive current is the smallest among drive currents supplied to the plurality of semiconductor laser devices.

4. The laser module according to claim 1, wherein the plurality of semiconductor laser devices includes:
a first group of semiconductor laser devices including the first semiconductor laser device, and
a second group of semiconductor laser devices including the second semiconductor laser devices, and
a maximum value of incidence angles of laser beams incident on the optical fiber from the first group of semiconductor laser devices and a maximum value of incidence angles of laser beams incident on the optical fiber from the second group of semiconductor laser devices are both less than or equal to a maximum acceptance angle of the optical fiber.

5. The laser module according to claim 4, wherein the maximum value of the incidence angles of the laser beams incident on the optical fiber from the first group of semiconductor laser devices is equal to the maximum value of the incidence angles of the laser beams incident on the optical fiber from the second group of semiconductor laser devices.

6. A laser system comprising:
the laser module according to claim 1 as a first laser module;
a first current supply unit that supplies the first drive current between the first pair of terminals of the first laser module; and
a second current supply unit that supplies the second drive current between the second pair of terminals of the first laser module.

7. The laser system as recited in claim 6, comprising:
another laser module according to claim 1 as a second laser module, wherein
the first current supply unit supplies the first drive current between the first pair of terminals of the first laser module and between the first pair of terminals of the second laser module, and
the second current supply unit supplies the second drive current between the second pair of terminals of the first laser module and between the second pair of terminals of the second laser module.

8. The laser system according to claim 6, wherein the optical path length of the laser beam from the laser output surface of one of the second semiconductor laser devices to the incidence surface of the condenser lens is the longest in the first laser module among optical path lengths of the laser beams from laser output surfaces of the plurality of semiconductor laser devices to the incidence surface of the condenser lens.

9. The laser system according to claim 8, wherein the second drive current is the smallest among drive currents supplied to the plurality of semiconductor laser devices.

10. The laser system according to claim 6, wherein the first laser module further comprises:
a first group of semiconductor laser devices including the first semiconductor laser device; and
a second group of semiconductor laser devices including the second semiconductor laser devices, wherein
a maximum value of incidence angles of laser beams incident on the optical fiber from the first group of semiconductor laser devices and a maximum value of incidence angles of laser beams incident on the optical fiber from the second group of semiconductor laser devices are both less than or equal to a maximum acceptance angle of the optical fiber.

11. The laser system according to claim 10, wherein the maximum value of the incidence angles of the laser beams incident on the optical fiber from the first group of semiconductor laser devices is equal to the maximum value of the incidence angles of the laser beams incident on the optical fiber from the second group of semiconductor laser devices.

12. The laser module according to claim 1, wherein the laser beam from the laser output surface of the first semiconductor laser device is incident on the incidence surface of the condenser lens at a height that is different from a height at which a laser beam from a laser output surface of any one of the second semiconductor laser devices is incident on the incidence surface of the condenser lens.

13. The laser module according to claim 12, wherein laser beams from laser output surfaces of the second semiconductor laser devices are incident on the incidence surface of the condenser lens at different heights.

* * * * *